(12) United States Patent
Li et al.

(10) Patent No.: US 9,450,029 B2
(45) Date of Patent: Sep. 20, 2016

(54) OLED DISPLAY PANEL AND METHOD FOR MANUFACTURING THE SAME

(71) Applicant: BOE TECHNOLOGY GROUP CO., LTD., Beijing (CN)

(72) Inventors: Yunfei Li, Beijing (CN); Kazuyoshi Nagayama, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/416,257

(22) PCT Filed: Apr. 17, 2014

(86) PCT No.: PCT/CN2014/075546
§ 371 (c)(1),
(2) Date: Jan. 21, 2015

(87) PCT Pub. No.: WO2015/096308
PCT Pub. Date: Jul. 2, 2015

(65) Prior Publication Data
US 2015/0357384 A1    Dec. 10, 2015

(30) Foreign Application Priority Data

Dec. 27, 2013 (CN) .......................... 2013 1 0741370

(51) Int. Cl.
*H01L 27/32* (2006.01)
*H01L 51/52* (2006.01)
*H01L 51/56* (2006.01)

(52) U.S. Cl.
CPC ......... *H01L 27/3216* (2013.01); *H01L 27/322* (2013.01); *H01L 27/326* (2013.01);
(Continued)

(58) Field of Classification Search
CPC ........... H01L 27/3216; H01L 27/3258; H01L 51/56; H01L 51/5231; H01L 27/322; H01L 2227/323
See application file for complete search history.

(56) References Cited

U.S. PATENT DOCUMENTS

| 5,294,870 A * | 3/1994 | Tang | ..................... | C09K 11/06 313/504 |
|---|---|---|---|---|
| 6,366,025 B1 | 4/2002 | Yamada | | |

(Continued)

FOREIGN PATENT DOCUMENTS

| CN | 101958340 A | 1/2011 |
|---|---|---|
| CN | 102104057 A | 6/2011 |

(Continued)

OTHER PUBLICATIONS

First Office Action regarding Chinese application No. 201310741370.6, dated Sep. 8, 2015. Translation provided by Dragon Intellectual Property Law Firm.

(Continued)

*Primary Examiner* — William Coleman
(74) *Attorney, Agent, or Firm* — Harness, Dickey & Pierce, P.L.C.

(57) ABSTRACT

Provided are OLED display panel and method for manufacturing the same. The OLED display panel includes a plurality of pixel units, each of the plurality of pixel units includes a light emitting region and a light transmitting region, the light emitting region is provided with a white organic light emitting device and a color filter; the light transmitting region is not provided with the color filter. According to embodiments of the present disclosure, a light transmitting region is particular added on the color filter, so that the transmittance can be increased, so as to obtain a better transparent display effect without an extra process, which can be achieved only by appropriately adjusting design.

20 Claims, 3 Drawing Sheets

(52) U.S. Cl.
CPC ....... *H01L27/3258* (2013.01); *H01L 51/5231* (2013.01); *H01L 51/56* (2013.01); *H01L 2227/323* (2013.01)

(56) References Cited

U.S. PATENT DOCUMENTS

| | | | | |
|---|---|---|---|---|
| 8,159,426 | B2* | 4/2012 | Chang | G09G 3/3208 313/463 |
| 9,030,384 | B2* | 5/2015 | Cheng | G09G 3/3208 345/63 |
| 9,184,405 | B2* | 11/2015 | Song | H01L 51/5004 |
| 2011/0175097 | A1 | 7/2011 | Song et al. | |
| 2014/0185129 | A1* | 7/2014 | Kim | H01L 51/5284 359/296 |

FOREIGN PATENT DOCUMENTS

| | | |
|---|---|---|
| CN | 102800813 A | 11/2012 |
| CN | 102982742 A | 3/2013 |
| CN | 103178079 A | 6/2013 |
| CN | 103474448 A | 12/2013 |
| CN | 103700692 A | 4/2014 |

OTHER PUBLICATIONS

Written Opinion of the International Searching Authority for international application No. PCT/CN2014/075546.
Second Office Action regarding Chinese application No. 201310741370.6, dated Apr. 5, 2016. Translation provided by Dragon Intellectual Property Law Firm.

* cited by examiner

US 9,450,029 B2

OLED DISPLAY PANEL AND METHOD FOR MANUFACTURING THE SAME

CROSS-REFERENCE TO RELATED APPLICATION

This application is the U.S. national phase of PCT Application No. PCT/CN2014/075546 filed on Apr. 17, 2014, which claims priority to Chinese Patent Application No. 201310741370.6 filed on Dec. 27, 2013, the disclosure of which is incorporated in its entirety by reference herein.

TECHNICAL FIELD

The present disclosure relates to the field of display technology, in particular to an organic light emitting diode display panel and a method for manufacturing the same.

BACKGROUND

Transparent display is a relative hot technology trend in recent year, both reflective type Liquid Crystal Display (LCD) and Organic Light-Emitting Diode (OLED) can achieve transparent display, in which OLED has a better transparent display effect.

The existing OLED display panel uses an OLED array substrate with a structure formed by combining a white OLED with a color filter, having a low transmittance and a poor transparent display effect.

SUMMARY

Embodiments of the present disclosure provides an OLED display panel and a method for manufacturing the same, to solve the problem of poor transparent display effect of OLED display panels in prior art.

In order to achieve the above objective, the present disclosure provides an organic light emitting diode (OLED) display panel, including a plurality of pixel units, each of the plurality of pixel units includes a light emitting region and a light transmitting region, the light emitting region is provided with a white organic light emitting device and a color filter;

the light transmitting region is not provided with the color filter.

Alternatively, a cathode of the white organic light emitting device is made of an opaque material or a semiopaque material, the light transmitting region is not provided with the cathode of the white organic light emitting device.

Alternatively, the light transmitting region is not provided with an anode and/or a light emitting function film of the white organic light emitting device.

Alternatively, the light transmitting region is arranged on a region of the pixel unit where a thin film transistor device and a metal wire are not provided.

Alternatively, the respective light transmitting regions in the plurality of pixel units have a same position and a same size.

Alternatively, the respective light transmitting regions in the plurality of pixel units have a different position and a different size.

Alternatively, the plurality of pixel units include a green pixel unit, a red pixel unit and a blue pixel unit, the light transmitting region of the green pixel unit has an area of $T_G$, the light transmitting region of the red pixel unit has an area of $T_R$, the light transmitting region of the blue pixel unit has an area of $T_B$, wherein $T_G > T_R > T_B$.

Alternatively, the OLED display panel includes an array substrate;
the array substrate includes a base substrate, a thin film transistor device and the color filter;
the thin film transistor device and the color filter are arranged on the base substrate;
an overcoat is arranged on the thin film transistor device and the color filter, the white organic light emitting device is arranged on the overcoat.

Alternatively, the OLED display panel includes an array substrate and a packaging substrate,
the array substrate includes a base substrate, a thin film transistor device and the white organic light emitting device;
the thin film transistor device and the white organic light emitting device are arranged on the base substrate;
the color filter is arranged on the packaging substrate at a position corresponding to the white organic light emitting device.

Embodiments of the present disclosure further provide a method for manufacturing an organic light emitting diode (OLED) display panel, which is used for manufacturing the above OLED display panel, including a step of:
forming the color filter and the white organic light emitting device in the light emitting region in each of the plurality of pixel units included in the OLED display panel, the light transmitting region in each of the plurality of pixel units is not provided with the color filter.

Alternatively, the method for manufacturing the OLED display panel according to embodiments of the present disclosure further includes a step of:
forming a cathode of the white organic light emitting device in the light emitting region in each of the plurality of pixel units, wherein the light transmitting region in each of the plurality of pixel units is not provided with the cathode.

Alternatively, the method for manufacturing the OLED display panel according to embodiments of the present disclosure further includes a step of:
forming an anode, a light emitting function film and a cathode of the white organic light emitting device in the light emitting region in each of the plurality of pixel units, wherein the light transmitting region in each of the plurality of pixel units is not provided with the anode, the light emitting function film and a cathode.

Alternatively, the method for manufacturing the OLED display panel according to embodiments of the present disclosure further includes a step of:
forming an anode and a light emitting function film of the white organic light emitting device in the light emitting region in each of the plurality of pixel units, wherein the light transmitting region in each of the plurality of pixel units is not provided with the anode and/or the light emitting function film.

Comparing with the prior art, the OLED display panel and the method for manufacturing the same according to embodiments of the present disclosure, through not providing the color filter in the light transmitting region in each of the plurality of the pixel units, can increase the transmittance, so as to obtain a better transparent display effect without an extra process, which can be achieved only by appropriately adjusting design.

FIGURE REFERENCE

010: thin film transistor, 020: color filter (CF),
030: white organic light-emitting device, 031: anode of white organic light emitting device, 031: cathode of white organic light emitting device,
040: light transmitting region, 050: light emitting region.

DETAILED DESCRIPTION

The OLED display panel according to embodiments of the present disclosure includes a plurality of pixel units, each of the plurality of pixel units includes a light emitting region and a light transmitting region, the light emitting region is provided with a white organic light emitting device and a color filter;

and wherein the light transmitting region is not provided with the color filter.

The OLED display panel according to embodiments of the present disclosure, through not providing the color filter in the light transmitting region in each of the plurality of pixel units, can increase the transmittance, so as to obtain a better transparent display effect without an extra process, which can be achieved only by appropriately adjusting design.

When being specifically implemented, a position, a size and an arrangement of the light transmitting region can be determined in line with specific design requirements, without special requirements. The pixels arrangement in the pixel unit may be in a strip way, or may be in a triangle way, or in other ways.

In an example, when a cathode of the white organic light emitting device is made of an opaque material or a semiopaque material, and the light transmitting region is not provided with the cathode of the white organic light emitting device, then the transmittance is further increased.

Figure 1A:
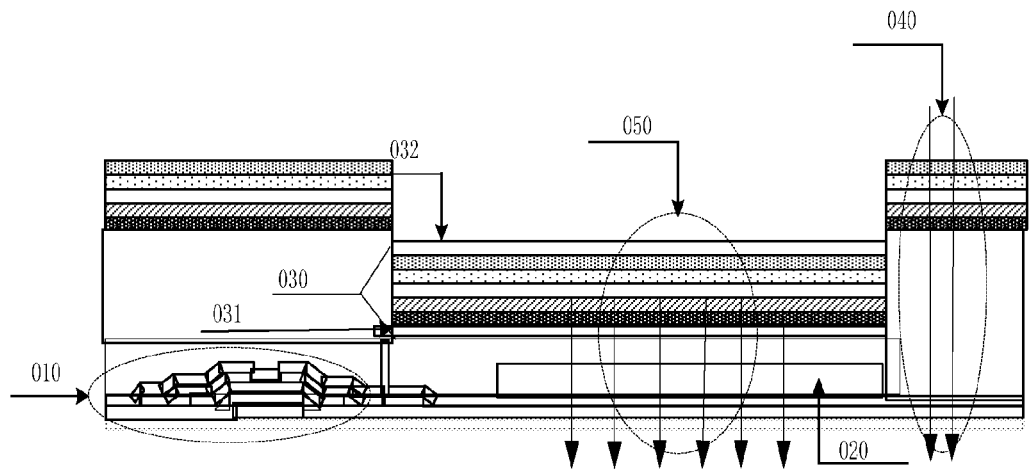
FIG. 1A is a structure schematic view of an OLED display panel according to an embodiment of the present disclosure.

As shown in FIG. 1A, when the cathode of the white organic light emitting device is made of an opaque material, the light transmitting region is not provided with the color filter and the cathode of the white organic light emitting device, so as to guarantee the transmittance of the light in the light transmitting region.

Figure 1B:
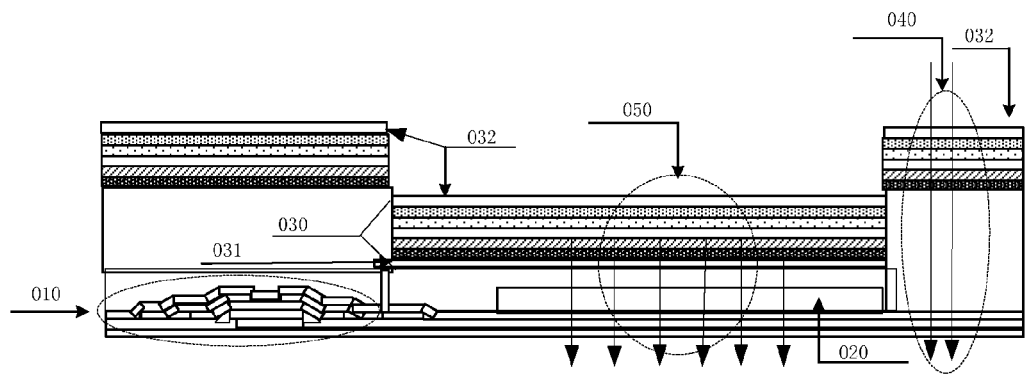
FIG. 1B is a structure schematic view of an OLED display panel according to another embodiment of the present disclosure.

As shown in FIG. 1B, when the cathode of the white organic light emitting device is made of a transparent material or a semiopaque material, the light transmitting region is not provided with the color filter, while the light transmitting region may be provided with the cathode of the white organic light emitting device. The reason for such arrangement is that: a Fine Metal Mask (FMM) is necessary to block the light transmitting region if the light transmitting region is not provided with the cathode of the white organic light emitting device, but the FMM has a relative higher cost, thus considering the cost problem, when the used material for the cathode of the white organic light emitting device has a relative higher transparency, the cathode of the white organic light emitting device may be arranged in the light transmitting region, by which both the transmittance and the cost can be taken into account.

Figure 1C:
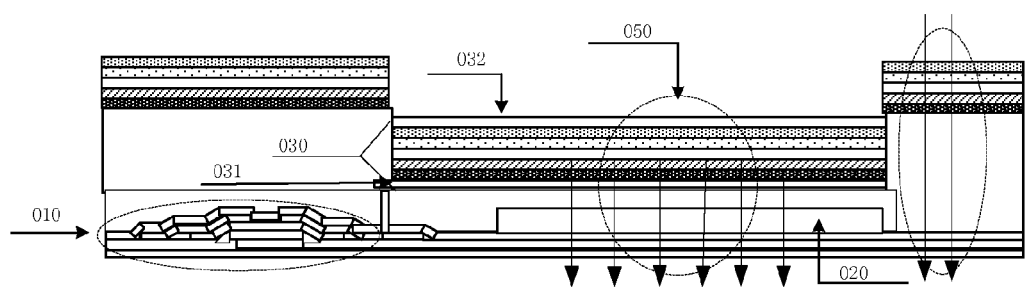
FIG. 1C is a structure schematic view of an OLED display panel according to still another embodiment of the present disclosure

As shown in FIG. 1C, when the cathode of the white organic light emitting device is made of a transparent material or a semiopaque material, the light transmitting region may also not be provided with the color filter and the cathode of the white organic light emitting device, so as to guarantee the transmittance of the light in the light transmitting region.

In an example, the light transmitting region is not provided with an anode and/or a light emitting function film of the white organic light emitting device, so as to further increase the transmittance.

For example, the light emitting function film of the white organic light emitting device may include a Hole Injection Layer (HIL), a Hole Transport Layer (HTL), an Emitting Layer (EML), an Electron Transport Layer (ETL), and an Electron Injection Layer (EIL).

Alternatively, the light transmitting region is arranged on a region of the pixel unit where a thin film transistor device and a metal wire are not provided, so as to avoid influencing the formation of the thin film transistor device and the metal wire by arranging the light transmitting region. The thin film transistor device and the metal wire may influence light transmission, thus the light transmitting region is arranged on a region where a thin film transistor device and a metal wire are not provided.

Alternatively, the respective light transmitting region may have a same position and a same size in each of the plurality of pixel units, or may have a different position and/or a different size in each of the plurality of pixel units.

Figure 2A:
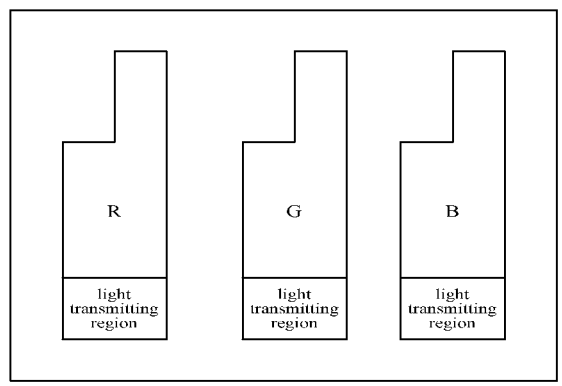
FIG. 2A, FIG. 2B, FIG. 2C, FIG. 2D are a schematic view of a light transmitting region and a light emitting region included in an OLED display panel according to embodiments of the present disclosure respectively.

In details, as shown in FIG. 2A, the plurality of pixel units include a red pixel unit R, a green pixel unit G, and a blue pixel unit B, a light transmitting region of the red pixel unit R locates at bottom of the red pixel unit R, a light transmitting region of the green pixel unit G locates at bottom of the green pixel unit G, a light transmitting region of the blue pixel unit B locates at bottom of the blue pixel unit B; the light transmitting region of the red pixel unit has an area of $T_R$, the light transmitting region of the green pixel unit has an area of $T_G$, the light transmitting region of the blue pixel unit has an area of $T_B$, $T_G = T_R = T_B$. In FIG. 2A, the light transmitting region of the red pixel unit R, the light transmitting region of the green pixel unit G and the light transmitting region of the blue pixel unit B have a same position and a same size.

Figure 2B:
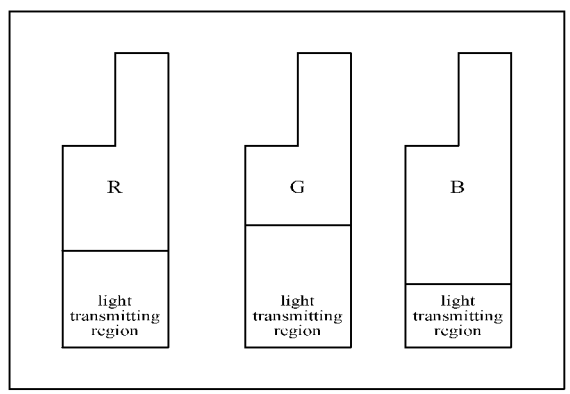

As shown in FIG. 2B, the plurality of pixel units include a red pixel unit R, a green pixel unit G, and a blue pixel unit B, a light transmitting region of the red pixel unit R locates at bottom of the red pixel unit R, a light transmitting region of the green pixel unit G locates at bottom of the green pixel unit G, a light transmitting region of the blue pixel unit B locates at bottom of the blue pixel unit B; the light transmitting region of the red pixel unit has an area of $T_R$, the light transmitting region of the green pixel unit has an area of $T_G$, the light transmitting region of the blue pixel unit has an area of $T_B$, $T_G > T_R > T_B$. As in most existing OLED display panels, the green pixel unit G has the most intensive light intensity, the red pixel unit R has a less intensive light intensity than the green pixel unit G, and the blue pixel unit B has the least intensive light intensity, thus in FIG. 2B, the area of the light transmitting region of the green pixel unit G is set as the largest one, the area of the light transmitting region of the red pixel unit R is set as a smaller one comparing with that of the green pixel unit G, and the area of the light transmitting region of the blue pixel unit B is set as the smallest one.

Figure 2C:
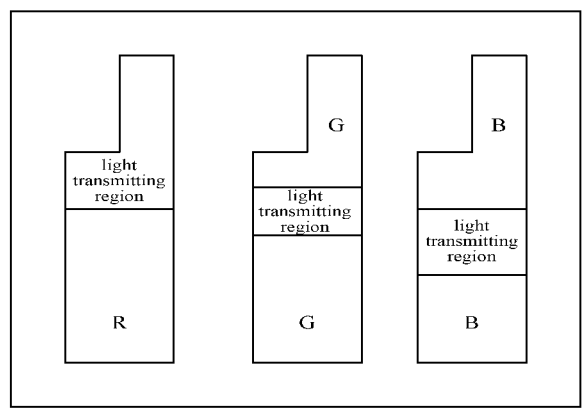

As shown in FIG. 2C, the plurality of pixel units include a red pixel unit R, a green pixel unit G, and a blue pixel unit B, a light transmitting region of the red pixel unit R locates at top of the red pixel unit R, a light transmitting region of the green pixel unit G locates in the middle of the green pixel unit G, a light transmitting region of the blue pixel unit B locates in the middle of the blue pixel unit B; the light transmitting region of the red pixel unit has an area of $T_R$, the light transmitting region of the green pixel unit has an area of $T_G$, the light transmitting region of the blue pixel unit has an area of $T_B$, $T_R > T_B > T_G$.

Figure 2D:
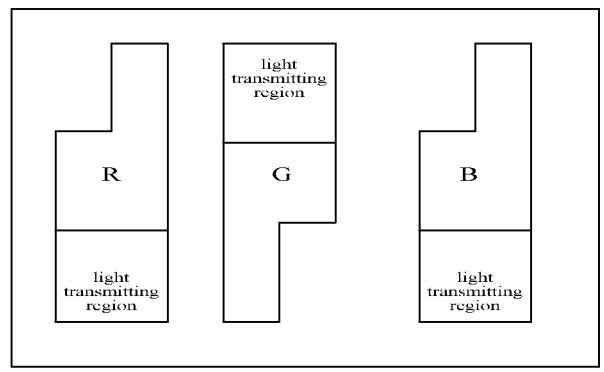

As shown in FIG. 2D, the plurality of pixel units include a red pixel unit R, a green pixel unit G, and a blue pixel unit B, a light transmitting region of the red pixel unit R locates at bottom of the red pixel unit R, a light transmitting region of the green pixel unit G locates at top of the green pixel unit G, a light transmitting region of the blue pixel unit B locates at bottom of the blue pixel unit B; the light transmitting region of the red pixel unit has an area of $T_R$, the light transmitting region of the green pixel unit has an area of $T_G$, the light transmitting region of the blue pixel unit has an area of $T_B$, $T_R = T_B = T_G$.

When the OLED display panel is a bottom emitting OLED display panel, the OLED display panel includes an array substrate; the array substrate includes a base substrate, a thin film transistor device and the color filter;
the thin film transistor device and the color filter are arranged on the base substrate;
an overcoat is arranged on the thin film transistor device and the color filter, the white organic light emitting device is arranged on the overcoat.

When manufacturing a bottom emitting OLED display panel, the manufacturing process includes: on the array substrate which is provided with a thin film transistor, manufacturing a Black Matrix (BM) and a color filter, and then manufacturing a white organic light emitting device.

When the OLED display panel is a top emitting OLED display panel, the OLED display panel includes an array substrate and a packaging substrate;
the array substrate includes a base substrate, a thin film transistor device and the white organic light emitting device;
the thin film transistor device and the white organic light emitting device are arranged on the base substrate;
the color filter is arranged on the packaging substrate at a position corresponding to the white organic light emitting device.

When manufacturing a top emitting OLED display panel, the manufacturing process includes: on the array substrate which is provided with a thin film transistor, manufacturing a white organic light emitting device, and then manufacturing a color filter. Comparing with manufacturing the bottom emitting OLED display panel, the order of manufacturing the color filter and the white organic light emitting device is adjusted, so as to meet the requirements for the top emitting OLED display panel.

The method for manufacturing the OLED display panel according to embodiments of the present disclosure, which is used for manufacturing the above OLED display panel, includes a step of:
forming the color filter and the white organic light emitting device in the light emitting region in each of the plurality of pixel units included in the OLED display panel, the light transmitting region in each of the plurality of pixel units is not provided with the color filter.

The method for manufacturing the OLED display panel according to embodiments of the present disclosure, through not providing the color filter in the light transmitting region in each of the plurality of the pixel units, can increase the transmittance, so as to obtain a better transparent display effect without an extra process, which can be achieved only by appropriately adjusting design.

Alternatively, the method for manufacturing the OLED display panel according to embodiments of the present disclosure, further includes a step of:
forming a cathode of the white organic light emitting device in the light emitting region in each of the plurality of pixel units, the light transmitting region in each of the plurality of pixel units is not provided with the cathode. By including such step, the transmittance may be further increased.

Alternatively, the method for manufacturing the OLED display panel according to embodiments of the present disclosure, further includes a step of:
forming an anode and a light emitting function film of the white organic light emitting device in the light emitting region in each of the plurality of pixel units, the light transmitting region in each of the plurality of pixel units is not provided with the anode and/or the light emitting function film. By including such step, the transmittance may be further increased.

Alternatively, the method for manufacturing the OLED display panel according to embodiments of the present disclosure, further includes a step of: forming an anode, a light emitting function film and a cathode of the white organic light emitting device in the light emitting region in each of the plurality of pixel units, the light transmitting region in each of the plurality of pixel units is not provided with the anode, the light emitting function film and the cathode. By including such step, the transmittance of the light transmitting region may be further increased.

When being specifically implemented, the OLED display panel according to embodiments of the present disclosure may be various OLED display panels manufactured on the array substrate, such as an amorphous silicon thin film transistor (a-Si TFT) OLED display panel, an oxide thin film transistor (Oxide TFT) OLED display panel, an polycrystalline silicon thin film transistor (ploy-Si TFT) OLED display panel.

In an embodiment of the present disclosure, the method for manufacturing the OLED display panel includes: manufacturing a thin film transistor device on an array substrate; manufacturing a color filter on the substrate provided with the thin film transistor device; manufacturing a white organic light emitting device on the substrate provided with the thin film transistor device and the color filter.

The base substrate is made of a transparent material. The transparent material, for example, may be glass, quartz, or may be a resin material with a good transparence, such as an acrylic resin, a methacrylic resin, and so on. The thin film transistor may be a top-gate type, or may be a bottom-gate type. The present embodiment takes the bottom-gate type thin film transistor as an example for illustration. A gate electrode layer pattern including a gate electrode, a gate insulating layer, an active layer pattern, a source-drain electrode layer pattern including a source electrode and a drain electrode and a passivation layer pattern are successively formed on the base substrate, so as to form the thin film transistor.

A color filter is formed in the light emitting region in each of the plurality of the pixel units, but not formed in the light emitting region. The color filter may use an organic resin material which can be passed through red color, green color, blue color or yellow color. The color filter may be formed by using a process of exposing and developing, or may be formed by using an inkjet printing process, a heat transfer process, and other processes, as long as guarantying that the light transmitting region is not provided with the color filter, while the light emitting region is provided with the color filter. For example, a layer of red resin material may be firstly coated, then an exposing region and a non-exposing region are formed by exposure using a mask, and then after development, the red resin in the exposing region is retained, i.e., a red color filter in light emitting region of the red pixel unit is formed, and red resin layer in the non-exposing region is removed. In a similar way, a green color filter in light emitting region of the green pixel unit and a blue color filter in light emitting region of the blue pixel unit are formed respectively. A Black Matrix (BM) may be formed prior to forming the color filter. The BM may be arranged between adjacent pixel units, preventing a color mixture of the lights respectively emitted from the light emitting regions of adjacent pixel units, and suppressing light leakage. The BM may also be arranged outside the light emitting region and the light transmitting region of the pixel unit, for example, arranged in a region where the thin film transistor locates, a region where the metal wire locates.

An overcoat is arranged on the substrate provided with the thin film transistor device and the color filter, and covers the thin film transistor device and the color filter. The light transmitting region of the pixel unit may be not provided with the overcoat, so as to further increase the transmittance of the light transmitting region in the pixel unit.

The white organic light emitting device is formed on the overcoat, including forming an anode, a light emitting function film and a cathode of the white organic light emitting device. Prior to forming the white organic light emitting device, a pixel define layer may be further formed. In which, the anode may be made of a transparent conductive material with high work-function, for example, Indium Tin Oxide (ITO). The anode may be formed by methods such as sputtering, evaporation, inkjet printing. The anode electrically connects to a drain electrode of the thin film transistor, for example, the anode connects to drain electrode of the thin film transistor through a via hole of the passivation layer and a via hole of the overcoat. A light emitting function film is formed on the anode, including forming a Hole Injection Layer (HIL), a Hole Transport Layer (HTL), an Emitting Layer (EML), an Electron Transport Layer (ETL), and an Electron Injection Layer (EIL). A cathode of the white organic light emitting device is formed on the light emitting function film. In the present embodiment, the light transmitting region of the pixel unit is not provided with the cathode. A Fine Metal Mask (FMM) evaporation cathode material may be used when forming the cathode, then the light transmitting region of the pixel unit is not provided with a cathode material layer, so that the transmittance of the light may be further increased in the light transmitting region. In the present embodiment, the light transmitting region of the pixel unit may also not provided with the anode and the light emitting function film, then the transmittance of the transmitting region may be further increased. A Fine Metal Mask may be used to form the anode and the light emitting function film.

The above are merely the preferred embodiments of the present disclosure. It should be noted that, a person skilled in the art may further make improvements and modifications without departing from the principle of the present disclosure, and these improvements and modifications shall also be considered as the scope of the present disclosure.

What is claimed is:

1. An organic light emitting diode (OLED) display panel, comprising a plurality of pixel units, wherein each of the plurality of pixel units comprises a light emitting region and a light transmitting region, the light emitting region is provided with a white organic light emitting device and a color filter;
    wherein the light transmitting region is not provided with the color filter;
    wherein a light emitting function film of the white organic light emitting device is arranged in the light transmitting region; and
    wherein the OLED display panel is bottom-emitting and comprises a plurality of thin film transistors respectively corresponding to the plurality of pixel units, and each of the plurality of thin film transistors does not overlap, in a light-emitting direction of the OLED display panel, an anode of the white organic light emitting device in the corresponding pixel unit.

2. The OLED display panel according to claim 1, wherein a cathode of the white organic light emitting device is made of an opaque material or a semiopaque material, the light transmitting region is not provided with the cathode of the white organic light emitting device.

3. The OLED display panel according to claim 1, wherein the light transmitting region is not provided with an anode of the white organic light emitting device.

4. The OLED display panel according to claim 1, wherein the light transmitting region of one pixel unit is arranged on a region of the pixel unit where the thin film transistor device corresponding to the one pixel unit and a metal wire are not provided.

5. The OLED display panel according to claim 1, wherein the respective light transmitting regions in the plurality of pixel units have a same position and a same size.

6. The OLED display panel according to claim 1, wherein the respective light transmitting regions in the plurality of pixel units have different positions and different sizes.

7. The OLED display panel according to claim 1, wherein the plurality of pixel units comprise a green pixel unit, a red pixel unit and a blue pixel unit, the light transmitting region of the green pixel unit has an area of $T_G$, the light transmitting region of the red pixel unit has an area of $T_R$, the light transmitting region of the blue pixel unit has an area of $T_B$, wherein $T_G > T_R > T_B$.

8. The OLED display panel according to claim 1, wherein the OLED display panel comprises an array substrate;
    the array substrate comprises a base substrate, the plurality of thin film transistors device and the color filters;
    the plurality of thin film transistor devices and the color filters are arranged on the base substrate; and
    an overcoat is arranged on the thin film transistor devices and the color filters, and the white organic light emitting devices are arranged on the overcoat.

9. The OLED display panel according to claim 1, wherein the OLED display panel comprises an array substrate and a packaging substrate,
    the array substrate comprises a base substrate, the plurality of thin film transistor devices and the white organic light emitting devices;
    the thin film transistor devices and the white organic light emitting devices are arranged on the base substrate; and
    the color filters are arranged on the packaging substrate at positions corresponding to the white organic light emitting devices.

10. A method for manufacturing the organic light emitting diode (OLED) display panel according to claim 1, comprising a step of:

forming the color filter and the white organic light emitting device in the light emitting region in each of the plurality of pixel units included in the OLED display panel, wherein the light transmitting region in each of the plurality of pixel units is not provided with the color filter.

11. The OLED display panel according to claim 2, wherein the light transmitting region is not provided with the anode of the white organic light emitting device.

12. The OLED display panel according to claim 2, wherein the light transmitting region of one pixel unit is arranged on a region of the pixel unit where the thin film transistor device corresponding to the one pixel unit and a metal wire are not provided.

13. The OLED display panel according to claim 2, wherein the anode and of the white organic light emitting device is arranged in the light transmitting region.

14. The OLED display panel according to claim 3, wherein the light transmitting region of one pixel unit is arranged on a region of the pixel unit where the thin film transistor device corresponding to the one pixel unit and a metal wire are not provided.

15. The OLED display panel according to claim 4, wherein the light transmitting region of one pixel unit is arranged on a region of the pixel unit where the thin film transistor device corresponding to the one pixel unit and a metal wire are not provided.

16. The OLED display panel according to claim 6, wherein the plurality of pixel units comprise a green pixel unit, a red pixel unit and a blue pixel unit, the light transmitting region of the green pixel unit has an area of $T_G$, the light transmitting region of the red pixel unit has an area of $T_R$, the light transmitting region of the blue pixel unit has an area of $T_B$, wherein $T_G > T_R > T_B$.

17. The OLED display panel according to claim 8, wherein the overcoat is not arranged in the light transmitting region.

18. The method according to claim 10, further comprising a step of:

forming a cathode of the white organic light emitting device in the light emitting region in each of the plurality of pixel units, wherein the light transmitting region in each of the plurality of pixel units is not provided with the cathode.

19. The method according to claim 10, further comprising a step of:

forming the anode, the light emitting function film and a cathode of the white organic light emitting device in the light emitting region in each of the plurality of pixel units, wherein the light transmitting region in each of the plurality of pixel units is not provided with the anode and the cathode.

20. The method according to claim 10, further comprising a step of:

forming the anode and the light emitting function film of the white organic light emitting device in the light emitting region in each of the plurality of pixel units, wherein the light transmitting region in each of the plurality of pixel units is not provided with the anode.

* * * * *